United States Patent
Feng et al.

(10) Patent No.: US 9,673,778 B2
(45) Date of Patent: *Jun. 6, 2017

(54) SOLID MOUNT BULK ACOUSTIC WAVE RESONATOR STRUCTURE COMPRISING A BRIDGE

(75) Inventors: Chris Feng, Fort Collins, CO (US); John Choy, Westminster, CO (US); Phil Nikkel, Loveland, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 985 days.

This patent is subject to a terminal disclaimer.

(21) Appl. No.: 13/337,458

(22) Filed: Dec. 27, 2011

(65) Prior Publication Data

US 2012/0161902 A1    Jun. 28, 2012

Related U.S. Application Data

(63) Continuation-in-part of application No. 12/490,525, filed on Jun. 24, 2009, now Pat. No. 8,248,185, and
(Continued)

(51) Int. Cl.
*H03H 9/15* (2006.01)
*H03H 9/13* (2006.01)
(Continued)

(52) U.S. Cl.
CPC ........ *H03H 9/132* (2013.01); *H03H 9/02118* (2013.01); *H03H 9/02149* (2013.01); *H03H 9/175* (2013.01)

(58) Field of Classification Search
CPC ............. H03H 9/02086; H03H 9/0211; H03H 9/02118; H03H 9/02125; H03H 9/132;
(Continued)

(56) References Cited

U.S. PATENT DOCUMENTS 5,162,691 A    11/1992 Mariani et al.
5,587,620 A    12/1996 Ruby et al.
(Continued)

FOREIGN PATENT DOCUMENTS

CN    101170303    4/2008
CN    101931380 A    12/2010
(Continued)

OTHER PUBLICATIONS

K.M. M Lakin, "Thin Film Resonators and Filters"; Proceedings of the 1999 IEEE Ultrasonics Symposium, vol. 2, pp. 895-906, Oct. 17-20, 1999.*
(Continued)

*Primary Examiner* — Barbara Summons

(57) ABSTRACT

A solid mount bulk acoustic wave resonator, comprises a first electrode; a second electrode; a piezoelectric layer disposed between the first and second electrodes; and an acoustic reflector comprising a plurality of layers and disposed beneath the first electrode, the second electrode and the piezoelectric layer. An overlap of the acoustic reflector, the first electrode, the second electrode and the piezoelectric layer defines an active area of the acoustic resonator, and the piezoelectric layer extends over an edge of the first electrode. The acoustic resonator also comprises a bridge adjacent to a termination of the active area of the acoustic resonator. The bridge overlaps a portion of the first electrode.

31 Claims, 12 Drawing Sheets

Related U.S. Application Data a continuation-in-part of application No. 12/626,035, filed on Nov. 25, 2009, now Pat. No. 8,902,023.

(51) Int. Cl.
 *H03H 9/02* (2006.01)
 *H03H 9/17* (2006.01)

(58) Field of Classification Search
 CPC ........ H03H 9/175; H03H 9/566; H03H 9/589; H03H 9/02133; H03H 9/02149
 USPC .......................... 333/187–192; 310/334, 335
 See application file for complete search history.

(56) References Cited

U.S. PATENT DOCUMENTS

| | | | |
|---|---|---|---|
| 5,873,153 | A | 2/1999 | Ruby et al. |
| 5,910,756 | A | 6/1999 | Ella |
| 6,107,721 | A | 8/2000 | Lakin |
| 6,215,375 | B1 | 4/2001 | Larson, III et al. |
| 6,262,637 | B1 | 7/2001 | Bradley et al. |
| 6,384,697 | B1 | 5/2002 | Ruby |
| 6,396,200 | B2 | 5/2002 | Misu et al. |
| 6,507,983 | B1 | 1/2003 | Ruby et al. |
| 6,709,776 | B2 | 3/2004 | Noguchi et al. |
| 6,828,713 | B2 | 12/2004 | Bradley et al. |
| 6,849,475 | B2 | 2/2005 | Kim |
| 7,002,437 | B2 | 2/2006 | Takeuchi et al. |
| 7,109,826 | B2 * | 9/2006 | Ginsburg et al. ............ 333/187 |
| 7,161,448 | B2 | 1/2007 | Feng et al. |
| 7,268,647 | B2 | 9/2007 | Sano et al. |
| 7,275,292 | B2 | 10/2007 | Ruby et al. |
| 7,280,007 | B2 | 10/2007 | Feng et al. |
| 7,281,304 | B2 | 10/2007 | Kim et al. |
| 7,301,260 | B2 * | 11/2007 | Kawakubo ............... H03H 3/02 310/320 |
| 7,332,985 | B2 | 2/2008 | Larson, III et al. |
| 7,358,831 | B2 | 4/2008 | Larson, III et al. |
| 7,369,013 | B2 | 5/2008 | Fazzio et al. |
| 7,388,454 | B2 | 6/2008 | Ruby |
| 7,482,737 | B2 * | 1/2009 | Yamada et al. ............. 310/363 |
| 7,567,023 | B2 | 7/2009 | Iwaki et al. |
| 7,575,292 | B2 | 8/2009 | Furukawa |
| 7,602,101 | B2 | 10/2009 | Hara et al. |
| 7,629,865 | B2 | 12/2009 | Ruby |
| 7,714,684 | B2 | 5/2010 | Ruby et al. |
| 7,737,807 | B2 | 6/2010 | Larson et al. |
| 7,791,434 | B2 * | 9/2010 | Fazzio et al. .................. 333/187 |
| 8,008,993 | B2 | 8/2011 | Milsom et al. |
| 8,084,919 | B2 | 12/2011 | Nishihara et al. |
| 8,248,185 | B2 * | 8/2012 | Choy et al. .................... 333/187 |
| 8,384,497 | B2 | 2/2013 | Zhang |
| 8,902,023 | B2 * | 12/2014 | Choy et al. .................... 333/187 |
| 2002/0158716 | A1 | 10/2002 | Pensala |
| 2004/0124952 | A1 * | 7/2004 | Tikka ................. H03H 9/02125 333/189 |
| 2005/0057324 | A1 * | 3/2005 | Onishi et al. .................. 333/191 |
| 2005/0248232 | A1 | 11/2005 | Itaya et al. |
| 2005/0269904 | A1 * | 12/2005 | Oka ............... 310/324 |
| 2006/0038636 | A1 | 2/2006 | Tsurumi et al. |
| 2006/0071736 | A1 * | 4/2006 | Ruby et al. ................... 333/187 |
| 2006/0132262 | A1 * | 6/2006 | Fazzio et al. ................. 333/187 |
| 2006/0226932 | A1 | 10/2006 | Fazzio et al. |
| 2007/0037311 | A1 | 2/2007 | Izumi et al. |
| 2007/0205850 | A1 | 9/2007 | Jamneala et al. |
| 2007/0247260 | A1 * | 10/2007 | Yanase et al. ................ 333/187 |
| 2007/0252476 | A1 * | 11/2007 | Iwaki et al. .................. 310/320 |
| 2007/0279153 | A1 | 12/2007 | Ruby |
| 2008/0024042 | A1 * | 1/2008 | Isobe et al. ................... 310/365 |
| 2008/0129417 | A1 | 6/2008 | Taniguchi |
| 2008/0143215 | A1 * | 6/2008 | Hara et al. .................... 310/328 |
| 2008/0169728 | A1 * | 7/2008 | Asai ................ H03H 3/04 310/334 |
| 2008/0258842 | A1 | 10/2008 | Ruby et al. |
| 2009/0079302 | A1 * | 3/2009 | Wall et al. .................... 310/365 |
| 2009/0267453 | A1 | 10/2009 | Barber et al. |
| 2010/0033063 | A1 | 2/2010 | Nishihara et al. |
| 2010/0327697 | A1 | 12/2010 | Choy et al. |
| 2010/0327994 | A1 | 12/2010 | Choy et al. |
| 2011/0084779 | A1 | 4/2011 | Zhang |
| 2011/0148547 | A1 | 6/2011 | Zhang |
| 2011/0180391 | A1 | 7/2011 | Larson, III et al. |
| 2012/0194297 | A1 | 8/2012 | Choy |
| 2013/0127300 | A1 | 5/2013 | Umeda et al. |

FOREIGN PATENT DOCUMENTS

| | | | |
|---|---|---|---|
| DE | 102007012384 | | 3/2007 |
| EP | 2299592 | | 12/2009 |
| FR | 2951027 | | 10/2009 |
| JP | 1157108 | | 6/1989 |
| JP | 2006-20277 | | 1/2006 |
| JP | 2006-186412 | | 7/2006 |
| JP | 2007-295306 | | 11/2007 |
| JP | 2008-066792 | * | 3/2008 |
| JP | 2008-131194 | * | 6/2008 |

OTHER PUBLICATIONS

Al-Ahmad, et al. "Piezoelectric-Based Tunable Microstrip Shunt Resonator", Proceedings of Asia Pacific Microwave Conference 2006, 4 pages.
English translation of JP2006-186412.
Office Action mailed Jul. 18, 2011 in U.S. Appl. No. 12/490,525.
Examiner's Interview Summary mailed Nov. 18, 2011 in U.S. Appl. No. 12/490,525.
Ex Parte Quayle Action mailed Jan. 25, 2012 in U.S. Appl. No. 12/490,525.
Notice of Allowance mailed Apr. 12, 2012 in U.S. Appl. No. 12/490,525.
Examiner's Interview Summary mailed Apr. 24, 2012 in U.S. Appl. No. 12/626,035.
Office Action mailed Jun. 25, 2012 in U.S. Appl. No. 12/626,035.
Examiner's Interview Summary mailed Nov. 13, 2012 in U.S. Appl. No. 12/626,035.
Examiner's Interview Summary mailed Dec. 5, 2012 in U.S. Appl. No. 12/626,035.
Office Action mailed Jun. 27, 2013 in U.S. Appl. No. 12/626,035.
Notice of Allowance mailed Sep. 16, 2013 in U.S. Appl. No. 12/626,035.
Notice of Allowance mailed Nov. 27, 2013 in U.S. Appl. No. 12/626,035.
Notice of Allowance mailed Jan. 28, 2014 in U.S. Appl. No. 12/626,035.
Notice of Allowance mailed Mar. 31, 2014 in U.S. Appl. No. 12/626,035.
Notice of Allowance mailed Jul. 22, 2014 in U.S. Appl. No. 12/626,035.
Office Action mailed Aug. 28, 2015 in Chinese Application No. 201210581765.X (Unofficial/non-certified translation provided by foreign agent included).
Machine translation of JP2007-295306, published Nov. 8, 2007, 15 pages.
Machine translation of JP32006-186412, published Jul. 13, 2006, 18 pages.
Machine translation of JP32008-66792, published Mar. 21, 2008, 39 pages.
Response and amended claims filed in Chinese Application No. 201210581765.X, Jan. 2016 (Unofficial/non-certified translation provided by foreign agent included).
English language machine translation of 2006-20277, published Jan. 19, 2006.
Office Action mailed Nov. 10, 2015 in co-pending U.S. Appl. No. 14/165,301.
Office Action dated May 3, 2016 in Chinese Application No. 201210581765.X (Unofficial/non-certified translation provided by foreign agent included).

(56) References Cited

OTHER PUBLICATIONS

Machine Translation for CN101931380, published Dec. 29, 2010.

* cited by examiner

SOLID MOUNT BULK ACOUSTIC WAVE RESONATOR STRUCTURE COMPRISING A BRIDGE

CROSS-REFERENCE TO RELATED APPLICATIONS

The present application is a continuation-in-part application under 37 C.F.R. § 1.53(b) of commonly owned U.S. patent application Ser. No. 12/490,525 (now U.S. Pat. No. 8,248,185), entitled "Acoustic Resonator Structure Comprising Bridge" and filed on Jun. 24, 2009; and a continuation-in-part application under 37 C.F.R. § 1.53(b) of commonly owned U.S. patent application Ser. No. 12/626,035 (now U.S. Pat. No. 8,902,023), entitled "Acoustic Resonator Structure having an Electrode with a Cantilevered Portion" and filed on Nov. 25, 2009. The present application claims priority under 35 U.S.C. § 120 to U.S. patent application Ser. Nos. 12/490,525 and 12/626,035. The disclosures of U.S. patent application Ser. Nos. 12/490,525 and 12/626,035 are specifically incorporated herein by reference.

BACKGROUND

In many electronic applications, electrical resonators are used. For example, in many wireless communications devices, radio frequency (rf) and microwave frequency resonators are used as filters to improve reception and transmission of signals. Filters typically include inductors and capacitors, and more recently resonators.

As will be appreciated, it is desirable to reduce the size of components of electronic devices. Many known filter technologies present a barrier to overall system miniaturization. With the need to reduce component size, a class of resonators based on the piezoelectric effect has emerged. In piezoelectric-based resonators, acoustic resonant modes are generated in the piezoelectric material. These acoustic waves are converted into electrical waves for use in electrical applications.

One type of piezoelectric resonator is a Bulk Acoustic Wave (BAW) Resonator. The BAW resonator has the advantage of small size and lends itself to Integrated Circuit (IC) manufacturing tools and techniques. The BAW resonator includes an acoustic stack comprising, inter alia, a layer of piezoelectric material disposed between two electrodes. Acoustic waves achieve resonance across the acoustic stack, with the resonant frequency of the waves being determined by the materials in the acoustic stack.

BAW resonators are similar in principle to bulk acoustic resonators such as quartz, but are scaled down to resonate at GHz frequencies. Because the BAW resonators have thicknesses on the order of microns and length and width dimensions of hundreds of microns, BAW resonators beneficially provide a comparatively compact alternative to known resonators.

Desirably, the bulk acoustic resonator excites only thickness-extensional (TE) modes, which are longitudinal mechanical waves having propagation (k) vectors in the direction of propagation. The TE modes desirably travel in the direction of the thickness (e.g., z-direction) of the piezoelectric layer.

Unfortunately, besides the desired TE modes there are lateral modes, known as Rayleigh-Lamb modes, generated in the acoustic stack as well. The Rayleigh-Lamb modes are mechanical waves having k-vectors that are perpendicular to the direction of TE modes, the desired modes of operation. These lateral modes travel in the areal dimensions of the piezoelectric material. Among other adverse effects, lateral modes deleteriously impact the quality (Q) factor of a BAW resonator device. In particular, the energy of Rayleigh-Lamb modes is lost at the inactive region and at the interfaces of the BAW resonator device. As will be appreciated, this loss of energy to spurious modes is a loss in energy of desired longitudinal modes, and ultimately a degradation of the Q-factor.

BAW resonators comprise an active area, and connections to and from the active area can increase losses, and thereby degrade the Q factor. For example, in transition regions between the active area and the connections, defects may form in the piezoelectric layer during fabrication as a result of the termination of the lower electrode of the BAW resonator structure. These defects can result in acoustic loss, and as a result a reduction in the Q factor.

What is needed, therefore, are an acoustic resonator structure electrical filter that overcomes at least the known shortcomings described above.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DEFINED TERMINOLOGY

Figure 1A:
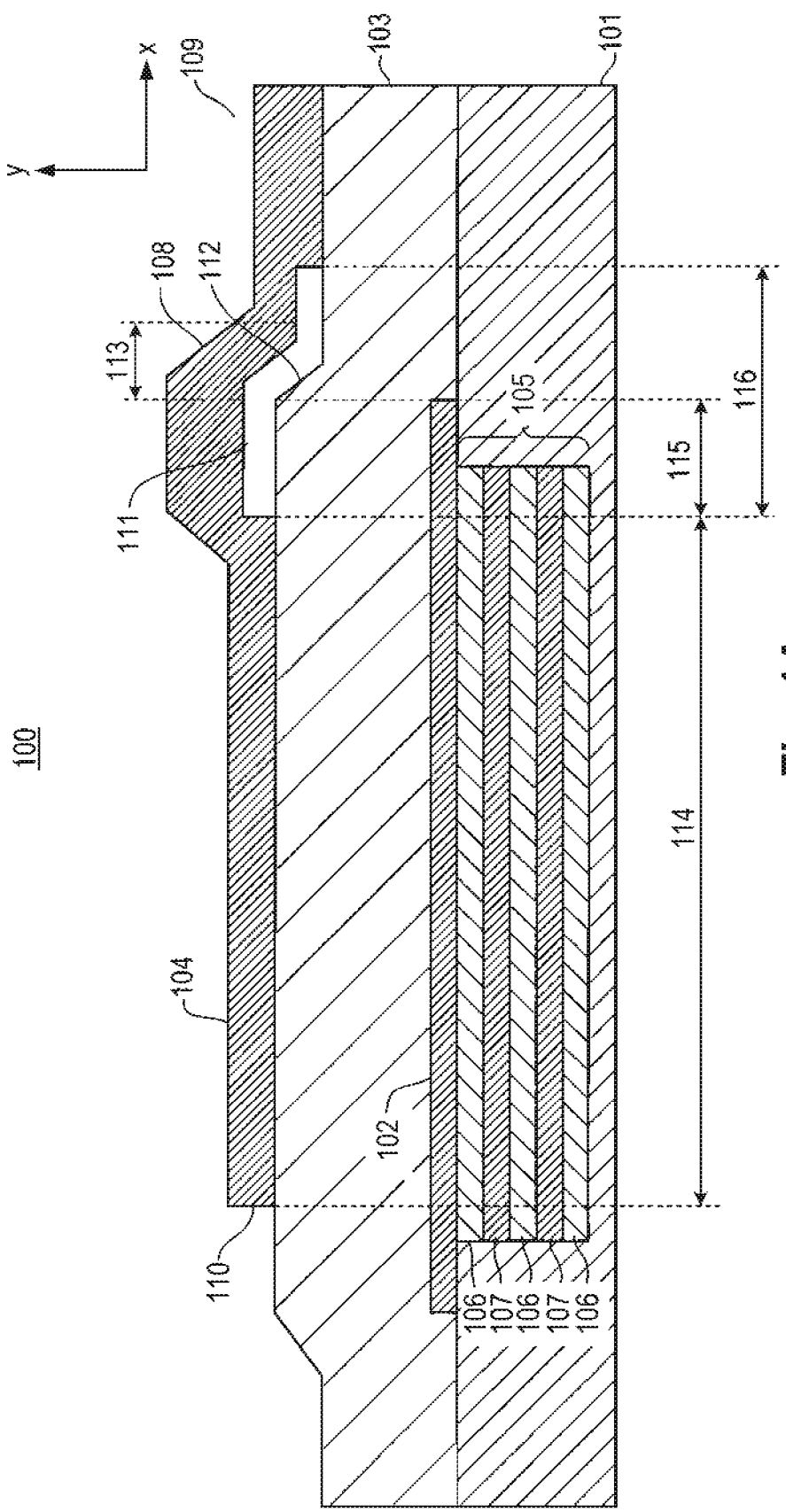
FIG. 1A shows a cross-sectional view of a solid mount bulk acoustic resonator (SMR) in accordance with a representative embodiment.

It is to be understood that the terminology used herein is for purposes of describing particular embodiments only, and is not intended to be limiting. The defined terms are in addition to the technical and scientific meanings of the defined terms as commonly understood and accepted in the technical field of the present teachings.

As used in the specification and appended claims, the terms 'a', 'an' and 'the' include both singular and plural referents, unless the context clearly dictates otherwise. Thus, for example, 'a device' includes one device and plural devices.

As used in the specification and appended claims, and in addition to their ordinary meanings, the terms 'substantial' or 'substantially' mean to with acceptable limits or degree. For example, 'substantially cancelled' means that one skilled in the art would consider the cancellation to be acceptable.

As used in the specification and the appended claims and in addition to its ordinary meaning, the term 'approximately' means to within an acceptable limit or amount to one having ordinary skill in the art. For example, 'approximately the same' means that one of ordinary skill in the art would consider the items being compared to be the same.

DETAILED DESCRIPTION

In the following detailed description, for purposes of explanation and not limitation, specific details are set forth in order to provide a thorough understanding of illustrative embodiments according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the illustrative embodiments. Such methods and apparatuses are clearly within the scope of the present teachings.

Generally, it is understood that the drawings and the various elements depicted therein are not drawn to scale. Further, relative terms, such as "above," "below," "top," "bottom," "upper" and "lower" are used to describe the various elements' relationships to one another, as illustrated in the accompanying drawings. It is understood that these relative terms are intended to encompass different orientations of the device and/or elements in addition to the orientation depicted in the drawings. For example, if the device were inverted with respect to the view in the drawings, an element described as "above" another element, for example, would now be below that element.

The present teachings relate generally to BAW resonator structures comprising SMRs. In certain applications, the BAW resonator structures provide SMR-based filters (e.g., ladder filters). Certain details of BAW resonators and resonator filters, materials thereof and their methods of fabrication may be found in one or more of the following commonly owned U.S. Patents and Patent Applications: U.S. Pat. No. 6,107,721 to Lakin; U.S. Pat. Nos. 5,587,620, 5,873,153, 6,507,983, 6,384,697, 7,275,292 and 7,629,865 to Ruby et al.; U.S. Pat. No. 7,280,007 to Feng, et al.; U.S. Patent App. Pub. No. 2007/0205850 to Jamneala et al.; U.S. Pat. No. 7,388,454 to Ruby et al.; U.S. Patent App. Pub. No. 2010/0327697 to Choy et al.; and U.S. Patent App. Pub. No. 2010/0327994 to Choy et al. The disclosures of these patents and patent applications are specifically incorporated herein by reference. It is emphasized that the components, materials and method of fabrication described in these patents and patent applications are representative and other methods of fabrication and materials within the purview of one of ordinary skill in the art are contemplated.

FIG. 1A is a cross-sectional view of an acoustic resonator 100 in accordance with an illustrative embodiment. Illustratively, the acoustic resonator 100 is an SMR structure. The acoustic resonator 100 comprises a substrate 101, which illustratively comprises silicon (Si) or other suitable material. A first electrode 102 is disposed over the substrate 101. A piezoelectric layer 103 is disposed over the first electrode 102 and a second electrode 104 is disposed over the piezoelectric layer 103. As such, the piezoelectric layer 103 has a first surface in contact with a first electrode 102 and a second surface in contact with the second electrode 104. The first and second electrodes 102, 104 include an electrically conductive material and provide an oscillating electric field in the y-direction, which is the direction of the thickness of the piezoelectric layer 103. In the present illustrative embodiment, the y-axis (of the coordinate system depicted in FIG. 1A) is the axis for the TE (longitudinal) mode(s) for the resonator.

The piezoelectric layer 103 and first and second electrodes 102, 104 are provided over an acoustic reflector 105 comprising alternating layers 106, 107 of high acoustic impedance material and low acoustic impedance materials formed in or on the substrate 101. Illustratively, the acoustic reflector 105 is a so-called acoustic Bragg reflector such as described in U.S. Pat. No. 6,107,721 to Lakin, or as described in commonly owned U.S. Pat. No. 7,332,985 to Larson, et al., or as described in commonly owned U.S. Pat. No. 7,358,831 to Larson. The disclosures of U.S. Pat. No. 6,107,721, U.S. Pat. No. 7,332,985 and U.S. Pat. No. 7,358,831 are specifically incorporated into the present disclosure by reference in their entirety.

The region of overlap of the first and second electrodes 102, 104, the piezoelectric layer 103 and the acoustic reflector 105 is referred to as an active area 114 of the acoustic resonator 100. As such, the acoustic resonator 100 is a mechanical resonator, which can be electrically coupled via the piezoelectric layer 103. By contrast, an inactive area of the acoustic resonator 100 comprises a region of overlap between first electrode 102, or second electrode 104, or both, and the piezoelectric layer 103 not disposed over the acoustic reflector 105. Illustratively, in the representative embodiment depicted in FIG. 1A, the inactive area comprises a region of overlap between the first electrode 102, the piezoelectric layer 103 and the second electrode 104, that is not disposed over acoustic reflector 105. As described more fully below, it is beneficial to the performance of the resonator to reduce the area of the inactive area of the acoustic resonator 100 to the extent practical.

When connected in a selected topology, a plurality of acoustic resonators 100 can act as an electrical filter. For example, the acoustic resonators 100 may be arranged in a ladder-filter arrangement, such as described in U.S. Pat. No. 5,910,756 to Ella, and U.S. Pat. No. 6,262,637 to Bradley, et al. The electrical filters may be used in a number of applications, such as in duplexers.

The acoustic resonator 100 also comprises a bridge 108 provided on an interconnection side 109 of the acoustic resonator 100. The interconnection side 109 is connected to a signal line (not shown) and electronic components (not shown) selected for the particular application of the acoustic resonator 100. This portion of the acoustic resonator 100 is often referred to as the interconnection side of the acoustic resonator 100. The second electrode 104 terminates at a position 110 over the acoustic reflector 105 in order to minimize the inactive area of the acoustic resonator 100 as described below. The position 110 opposes the interconnect side 109 of the acoustic resonator 100.

The bridge 108 comprises a gap 111 formed beneath a portion of the second electrode 104. Illustratively, and as described below, after removal of a sacrificial layer (not shown) provided in the formation of the gap 111, the gap 111 comprises air. However, the gap 111 may comprise other materials including low acoustic impedance materials, such as carbon (C) doped $SiO_2$, which is also referred as Black-diamond; or dielectric resin commercially known as SiLK; or benzocyclobutene (BCB). Such low acoustic impedance materials may be provided in the gap 111 by known methods. The low acoustic impedance material may be provided after removal of sacrificial material used to form the gap 111 (as described below), or may be used instead of the sacrificial material in the gap 111, and not removed.

In a representative embodiment, the bridge 108 is formed by providing a sacrificial layer (not shown) over the first electrode 102 and a portion of the piezoelectric layer 103 on the interconnect side and forming the second electrode 104 over the sacrificial layer. Illustratively, the sacrificial material comprises phosphosilicate glass (PSG), which illustratively comprises 8% phosphorous and 92% silicon dioxide. Subsequent layers such as the piezoelectric layer 103 and the second electrode 104 are deposited, sequentially, upon the PSG until the final structure is developed. Notably, a seed layer (not shown) may be provided over the first electrode 102 before depositing the piezoelectric layer 103, and a passivation layer (not shown) may be deposited over the second electrode 104. After the formation of the structure comprising the bridge 108, the PSG sacrificial layer is etched away illustratively with hydrofluoric acid leaving the free-standing bridge 108.

The piezoelectric layer 103 comprises a transition 112 formed during the formation of the piezoelectric layer 103 over the first electrode 102 and the substrate 101. The piezoelectric layer 103 at the transition 112 often comprises material defects and voids, particularly structural defects such as lattice defects and voids. These defects and voids can result in losses of acoustic energy of the mechanical waves propagating in the piezoelectric material. As should be appreciated, acoustic energy loss results in a reduction in the Q-factor of the acoustic resonator 100. However, and as described below, by separating the second electrode 104 from the piezoelectric layer 103 in a region 113 of the gap 111 where the transition 112 occurs, the portion of the active area 114 of the acoustic resonator 100 necessarily does not include the transition 112 of the piezoelectric layer 103 that includes the defects and voids therein. As a result, acoustic losses due to the defects and voids in the piezoelectric layer 103 at the transition 112 are reduced and the Q-factor is improved compared to known resonators, such as known FBARs.

Additionally, and beneficially, the bridge 108 provides an acoustic impedance mismatch at the boundary of the active area 114 on the interconnect side of the acoustic resonator 100. This acoustic impedance mismatch results in the reflection of acoustic waves at the boundary that may otherwise propagate out of the active area 114 and be lost, resulting in energy loss. By preventing such losses, the bridge 108 results in an increased Q-factor in the acoustic resonator 100. Moreover, the termination of the second electrode 104 at position 110 terminates the active area 114 of the acoustic resonator 100 and reduces losses by creating an acoustic impedance mismatch. This also provides an improvement in the Q-factor.

In addition to terminating the active area 114 of the acoustic resonator 100 before the transition 112, the bridge 108 also reduces the area of an inactive region of the acoustic resonator 100. The inactive region of the acoustic resonator 100 creates a parasitic capacitance, which in an equivalent circuit is electrically in parallel with the intrinsic capacitance of the active area 114 of the acoustic resonator 100. This parasitic capacitance degrades the effective coupling coefficient ($kt^2$), and therefore it is beneficial to reduce the parasitic capacitance. Beneficially, reducing the area of the inactive region improves the effective coupling coefficient ($kt^2$).

Bridge 108 has a width 115 defined as distance of overlap of the first electrode 102 and the bridge 108. As the width 115 increases, the Q-factor of the acoustic resonator 100 increases. The effective coupling coefficient ($kt^2$) also increases with increasing width 115 to an extent. Thus, the selection of a particular width 115 results in an improvement in Q and $kt^2$ due to reduced acoustic losses due to the reduction in the inactive area. However, while $kt^2$ increases and the parasitic capacitance decreases through inclusion of the bridge 108 in the acoustic resonator structures of the representative embodiments, there is a point at which increasing the width 115 further will result in a decrease in the active area 114 of the acoustic resonator 100. This decrease in the active area 114 will result in an undesired increase in the parasitic capacitance and a reduction in $kt^2$. Generally, the optimal width 115 of the bridge 108 is determined experimentally.

The bridge 108 has an overall width 116 as depicted in FIG. 1A. Some marginal improvement in the Q-factor of the acoustic resonator 100 is realized by increasing the overall width 116, and thereby increasing the separation of the second electrode 104 from the piezoelectric layer 103 beyond the width 115.

Figure 1B:
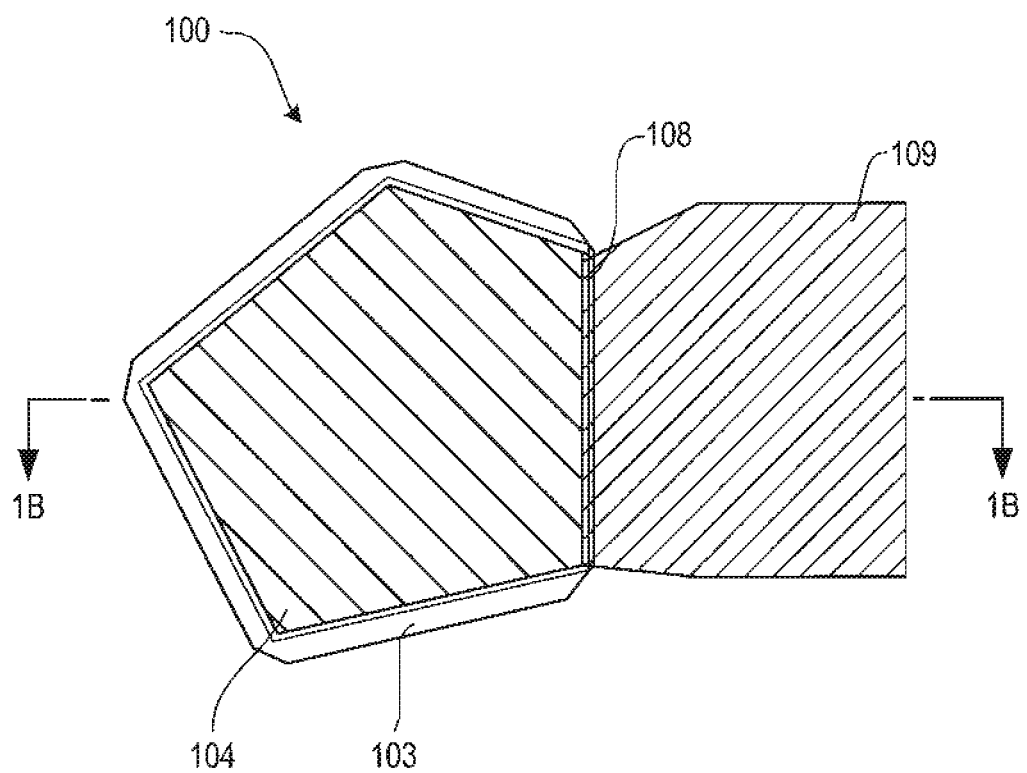
FIG. 1B shows a top view of the SMR of the representative embodiment of FIG. 1A.

FIG. 1B shows a top view of the acoustic resonator 100 of FIG. 1A. Notably, the cross-sectional view of the acoustic resonator 100 shown in FIG. 1A is taken along the line 1B-1B. The second electrode 104 of the present embodiment is apodized to reduce acoustic losses. Further details of the use of apodization in acoustic resonators may be found in commonly owned U.S. Pat. No. 6,215,375 to Larson III, et al; or in commonly owned U.S. Pat. No. 7,629,865 to Richard C. Ruby. The disclosures of U.S. Pat. No. 6,215,375 and U.S. Pat. No. 7,629,865 are specifically incorporated herein by reference in their entirety.

The fundamental mode of the acoustic resonator 100 is the longitudinal extension mode or "piston" mode. This mode is excited by the application of a time-varying voltage to the first and second electrodes 102, 104 at the resonant frequency of the acoustic resonator 100. The piezoelectric material converts energy in the form of electrical energy into mechanical energy. In an ideal SMR having infinitesimally thin electrodes, resonance occurs when the applied frequency is equal to the velocity of sound of the piezoelectric medium divided by twice the thickness of the piezoelectric medium: $f=v_{ac}/(2*T)$, where T is the thickness of the piezoelectric medium and $v_{ac}$ is the acoustic phase velocity. For resonators with finite thickness electrodes, this equation is modified by the weighted acoustic velocities and thicknesses of the electrodes.

A quantitative and qualitative understanding of the Q of a resonator may be obtained by plotting on a Smith Chart the ratio of the reflected energy to applied energy (i.e., the $S_{11}$ parameter) as the frequency is varied for the case in which one electrode is connected to ground and another to signal, for an SMR resonator with an impedance equal to the system impedance at the resonant frequency. As the frequency of the applied energy (e.g., RF signal) is increased, the magnitude/phase of the SMR resonator sweeps out a circle in a clockwise fashion on the Smith Chart. This is referred to as the Q-circle. Where the Q-circle first crosses the real axes (horizontal axes), this corresponds to the series resonance frequency $f_s$. The real impedance (as measured in Ohms) is $R_s$. As the Q-circle continues around the perimeter of the Smith chart, it again crosses the real axes. The second point at which the Q circle crosses the real axis is labeled $f_p$, the parallel or anti-resonant frequency of the SMR. The real impedance at $f_p$ is $R_p$.

Often it is desirable to minimize $R_s$ while maximizing $R_p$. Qualitatively, the closer the Q-circle "hugs" the outer rim of the Smith chart, the higher the Q-factor of the device. The Q-circle of an ideal lossless resonator would have a radius of one and would be at the edge of the Smith chart. However, as noted above, there are energy losses that impact the Q of the device. For instance, and in addition to the sources of acoustic losses mentioned above, Rayleigh-Lamb (lateral or spurious) modes are in the x,y dimensions of the piezoelectric layer 103. These lateral modes are due to interfacial mode conversion of the longitudinal mode traveling in the z-direction; and due to the creation of non-zero propagation vectors, $k_x$ and $k_y$, for both the TE mode and the various lateral modes (e.g., the S0 mode and the zeroth and first flexure modes, A0 and A1), which are due to the difference in effective velocities between the regions where electrodes are disposed and the surrounding regions of the resonator where there are no electrodes.

Regardless of their source, the lateral modes are parasitic in many resonator applications. For example, the parasitic lateral modes couple at the interfaces of the resonator and remove energy available for the longitudinal modes and thereby reduce the Q-factor of the resonator device. Notably, as a result of parasitic lateral modes and other acoustic losses sharp reductions in Q can be observed on a Q-circle of the Smith Chart of the $S_{11}$ parameter. These sharp reductions in Q-factor are known as "rattles" or "loop-de-loops," which are shown and described in the parent application.

As described more fully in the incorporated U.S. Pat. Nos. 6,215,375 and 7,629,865, the apodized first and second electrodes 102, 104 cause reflections of the lateral modes at the interfaces of the resonator non-constructively, therefore reduce the magnitude of lateral modes which otherwise propagate outside the active area 114 of the acoustic resonator 100 and are lost. These losses are sometimes referred to as "anchor-point" losses. Beneficially, because these lateral modes are not coupled out of the acoustic resonator 100 and developed to higher magnitude, energy loss can be mitigated with the at least a portion of reflected lateral modes being converted to longitudinal modes through mode conversion. Ultimately, this results in an overall improvement in the Q-factor.

Figure 1C:
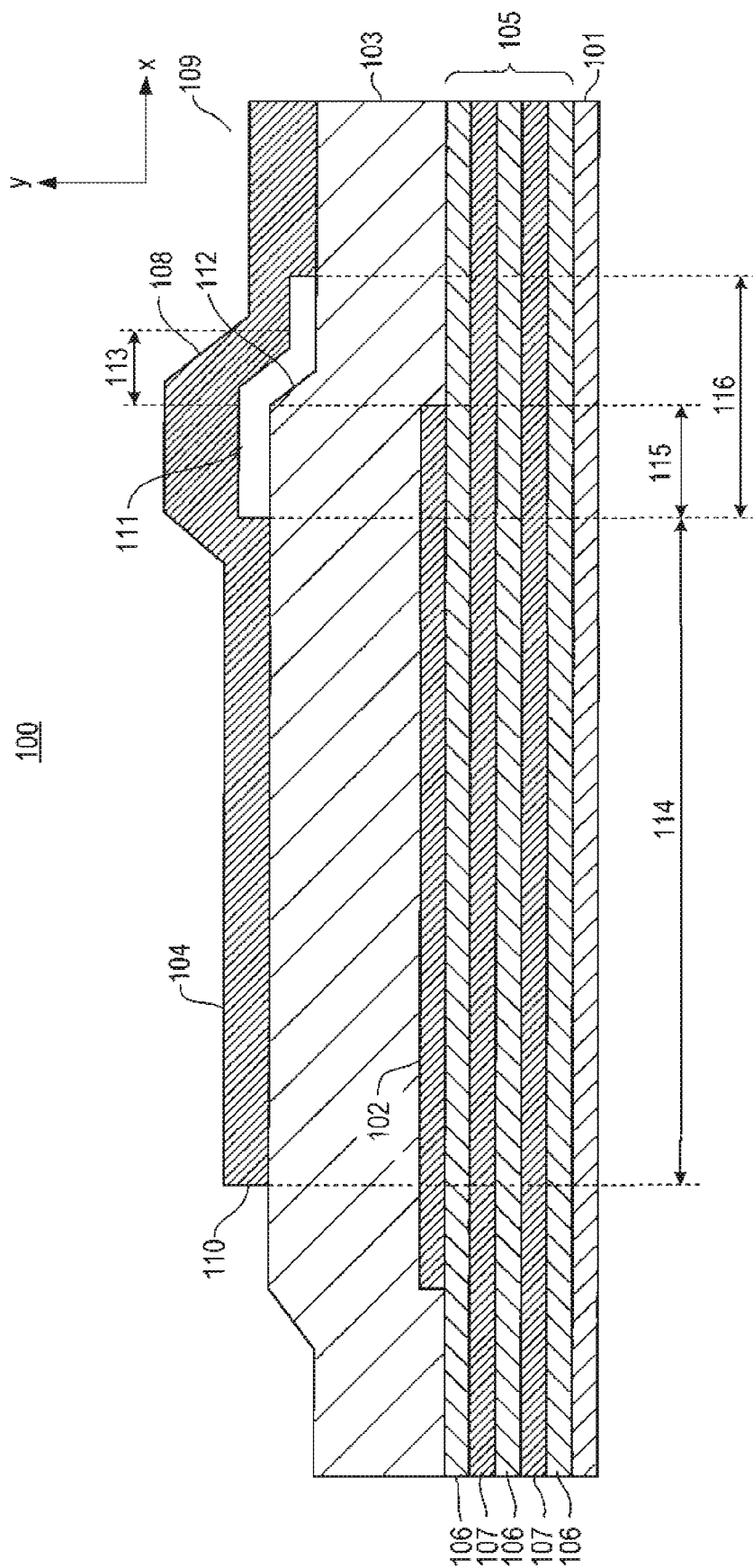
FIG. 1C shows a cross-sectional view of a solid mount resonator in accordance with another representative embodiment.

FIG. 1C is a cross-sectional view of acoustic resonator 100 in accordance with an illustrative embodiment. Illustratively, the acoustic resonator 100 is an SMR structure. The acoustic resonator 100 comprises substrate 101, first electrode 102 disposed over the substrate 101, piezoelectric layer 103 disposed over the first electrode 102, and second electrode 104 disposed over the piezoelectric layer 103. The acoustic resonator 100 depicted in FIG. 1C comprise acoustic reflector 105 with alternating layers 106, 107 of high acoustic impedance material and low acoustic impedance material.

Many aspects of the acoustic resonator 100 depicted in FIG. 1C are common to the acoustic resonator 100 described above in connection with FIG. 1A. These common details are not repeated in order to avoid obscuring the description of this embodiment. However, unlike the embodiment of FIG. 1A, in the representative embodiment depicted in FIG. 3, the acoustic reflector 105 extends beyond the active area 114 of the acoustic resonator 100, and extends between adjacent acoustic resonators (not shown) disposed over the same substrate 101. In this embodiment, the inactive area of the acoustic resonator 100 comprises an overlap of one of the first or second electrodes 102, 104 and the piezoelectric layer 103. Finally, in representative embodiments described below, the acoustic reflector 105 is disposed beneath its respective acoustic resonator 100 (e.g., as in FIG. 1A). However, the present teachings contemplate the use of acoustic reflector 105 extending between adjacent acoustic resonators (not shown) disposed over a common substrate (e.g., substrate 101).

Figure 2:
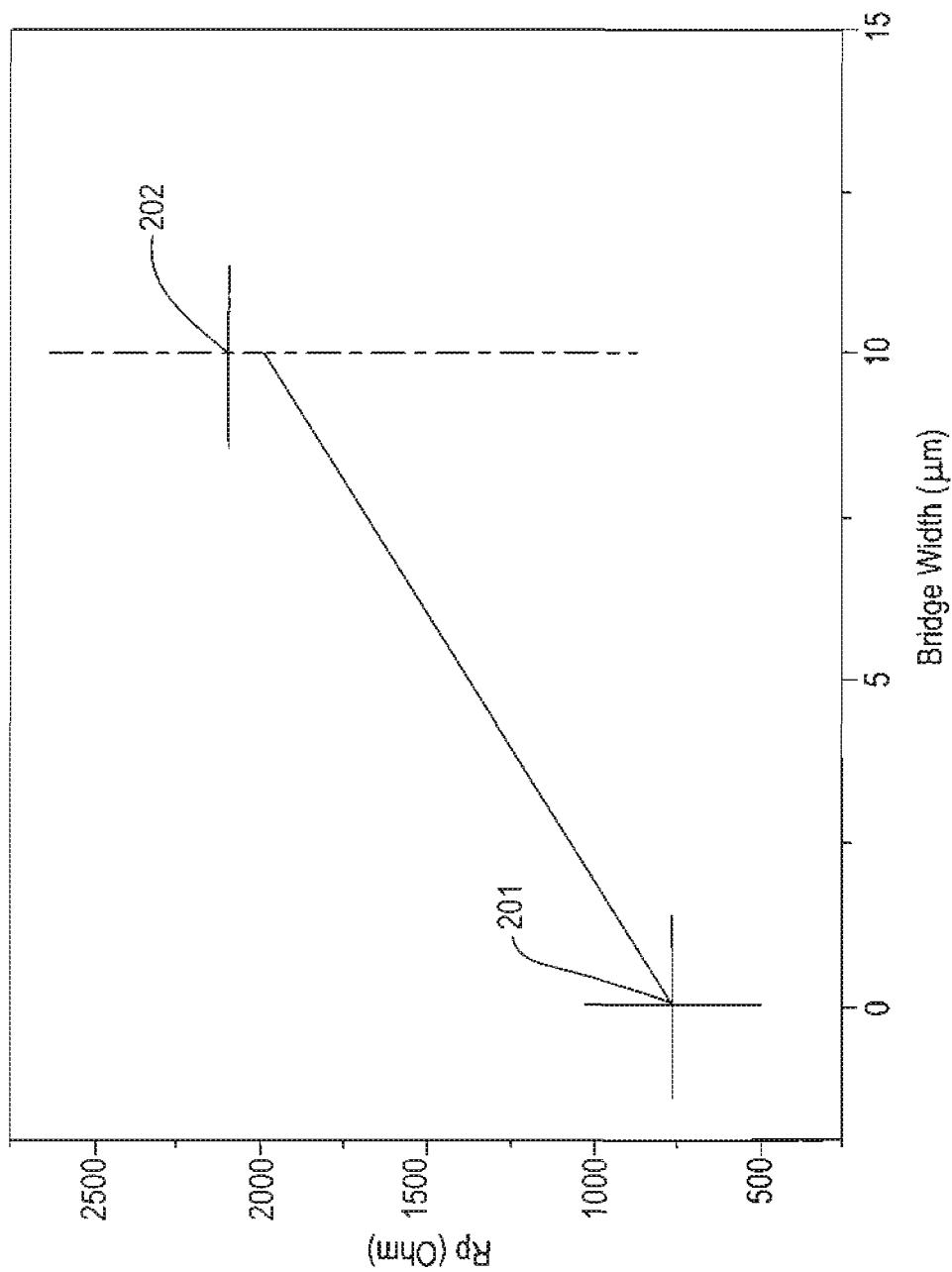
FIG. 2 shows a cross-sectional view of a solid mount bulk acoustic resonator (SMR) in accordance with a representative embodiment.

FIG. 2 shows a graph of the Q-factor versus the width 115 of the bridge 108 of acoustic resonator 100 in accordance with a representative embodiment. Point 201 represents the Q-factor of a known SMR that does not include the bridge of the representative embodiments. The acoustic losses due to defects in the transition 112 and a comparative increase in the area of the inactive region of the acoustic resonator 100 combine to result in a Q-factor that is comparatively low (approximately 850Ω). By contrast, when the width 115 of the bridge 108 of a representative embodiment is selected to be approximately 10 μm, the inactive area of the acoustic resonator 100 is decreased, with the bridge 108 and region 113 comprising a comparatively increased dimension. As can be seen in point 202 of FIG. 2, the Q-factor increases to approximately 2500Ω. As should be appreciated, the reduction in the inactive area on the interconnect side of the acoustic resonator 100 results in a decrease in losses due to defects in the piezoelectric layer 103 and an acoustic impedance mismatch at the boundary of the active area 114 of the acoustic resonator 100 at the interconnect side of the acoustic resonator 100.

Figure 3:
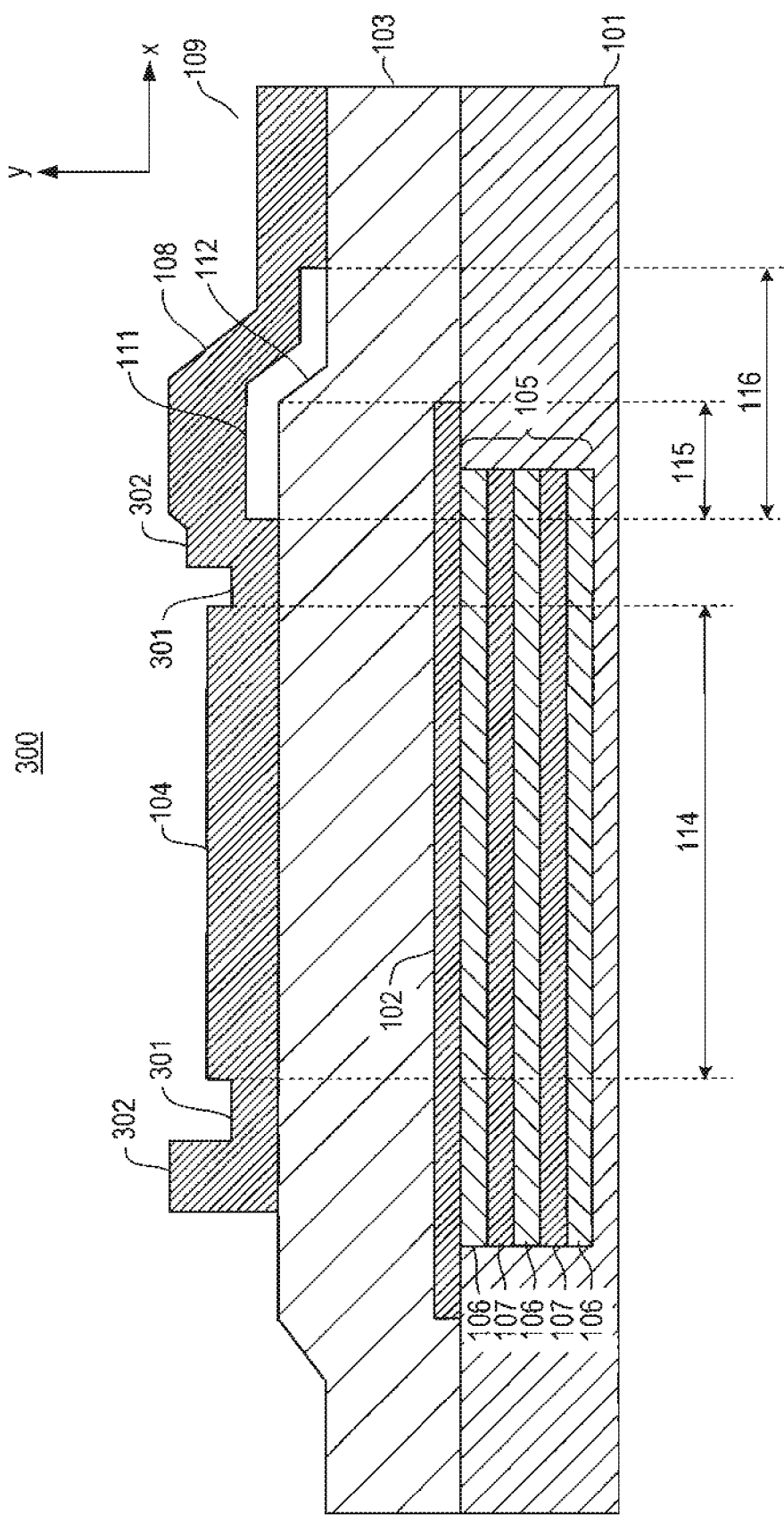
FIG. 3 shows a cross-sectional view of a solid mount bulk acoustic resonator (SMR) in accordance with a representative embodiment.

FIG. 3 is a cross-sectional view of an acoustic resonator 300 in accordance with an illustrative embodiment. The acoustic resonator 300, which is an SMR, shares many common features with the acoustic resonator 100 described previously. Many of these common details are often not repeated in order to avoid obscuring the presently described embodiments.

The acoustic resonator 300 comprises substrate 101. First electrode 102 is disposed over the substrate 101. Piezoelectric layer 103 is disposed over the first electrode 102 and the second electrode 104 is disposed over the piezoelectric layer 103. The first and second electrodes 102, 104 include an electrically conductive material and provide an oscillating electric field in the y-direction, which is the direction of the thickness of the piezoelectric layer 103. In the present illustrative embodiment, the y-axis (of the coordinate system depicted in FIG. 3) is the axis for the TE (longitudinal) mode(s) for the resonator. The acoustic resonator 300 comprises acoustic reflector 105 described above.

The acoustic resonator 300 comprises a recess 301 (often referred to as an 'innie') and a frame element 302 (also referred to as an 'outie'). The recess 301 may be provided one or more sides of the second electrode 104. Similarly, the frame element 302 may be provided over one or more sides of the second electrode 104. The recess 301 and frame element 302 provide an acoustic mismatch at the perimeter of the second electrode 104, suppress unwanted lateral modes and improve reflections of acoustic waves at the impedance discontinuity. Consequently, the recess 301 and frame element 302 serve to reduce acoustic losses in the acoustic resonator 300.

The region of overlap of the first and second electrodes 102, 104, the piezoelectric layer 103 and the acoustic reflector 105 that does not include recess 301 or frame elements 302 (i.e., "inside" the recess 301 in the embodiment depicted in FIG. 3) define the active area 114 of the acoustic resonator 300. By contrast, an inactive area of the acoustic resonator 300 comprises a region of overlap between first electrode 102, or second electrode 104, or both, and the piezoelectric layer 103 not disposed over the acoustic reflector 105. The recess 301 and frame elements 302 provide acoustic impedance discontinuities to provide reflection of modes back into the active area 114 of the acoustic resonator 300 and reduce energy loss into the inactive area of the acoustic resonator 300. The recess 301 and frame elements 302 are also provided to suppress unwanted lateral modes from being reflected back into the active area 114. Ultimately, reduced losses translate into an improved Q-factor of the acoustic resonator 300.

In the representative embodiment depicted in FIG. 3, the recess 301 and the frame element 302 are shown on the second electrode 104. Notably, recess 301, or the frame element 302, or both, may instead each be provided on one or more sides of the first electrode 102, or selectively on both the first and second electrodes 102, 104. Moreover, the frame elements 302 may be made from the same material as the second electrode 104 or the first electrode 102, or be a separate material disposed on the second electrode 104 or on the first electrode 102, or both. Further details of the use, formation and benefits of the recess 301 and the frame element 302 are found for example, in one or more of the following commonly owned U.S. Pat. No. 7,164,448 to Ruby, et al.; U.S. Pat. No. 7,280,007 to Feng, et al.; U.S. Pat. No. 7,369,013 to Fazzio, et al.; U.S. Pat. No. 7,388,454 to Fazzio, et al.; U.S. Pat. No. 7,714,684 to Ruby, et al.; and commonly owned U.S. Patent Application Publication 20070205850 entitled "Piezoelectric Resonator Structure and Electronic Filters having Frame Elements" to Jamneala, et al. The disclosures of U.S. Pat. Nos. 7,280,007 and 7,369,013, and U.S. Patent Application Publication 20070205850 are specifically incorporated herein by reference.

Figure 4A:
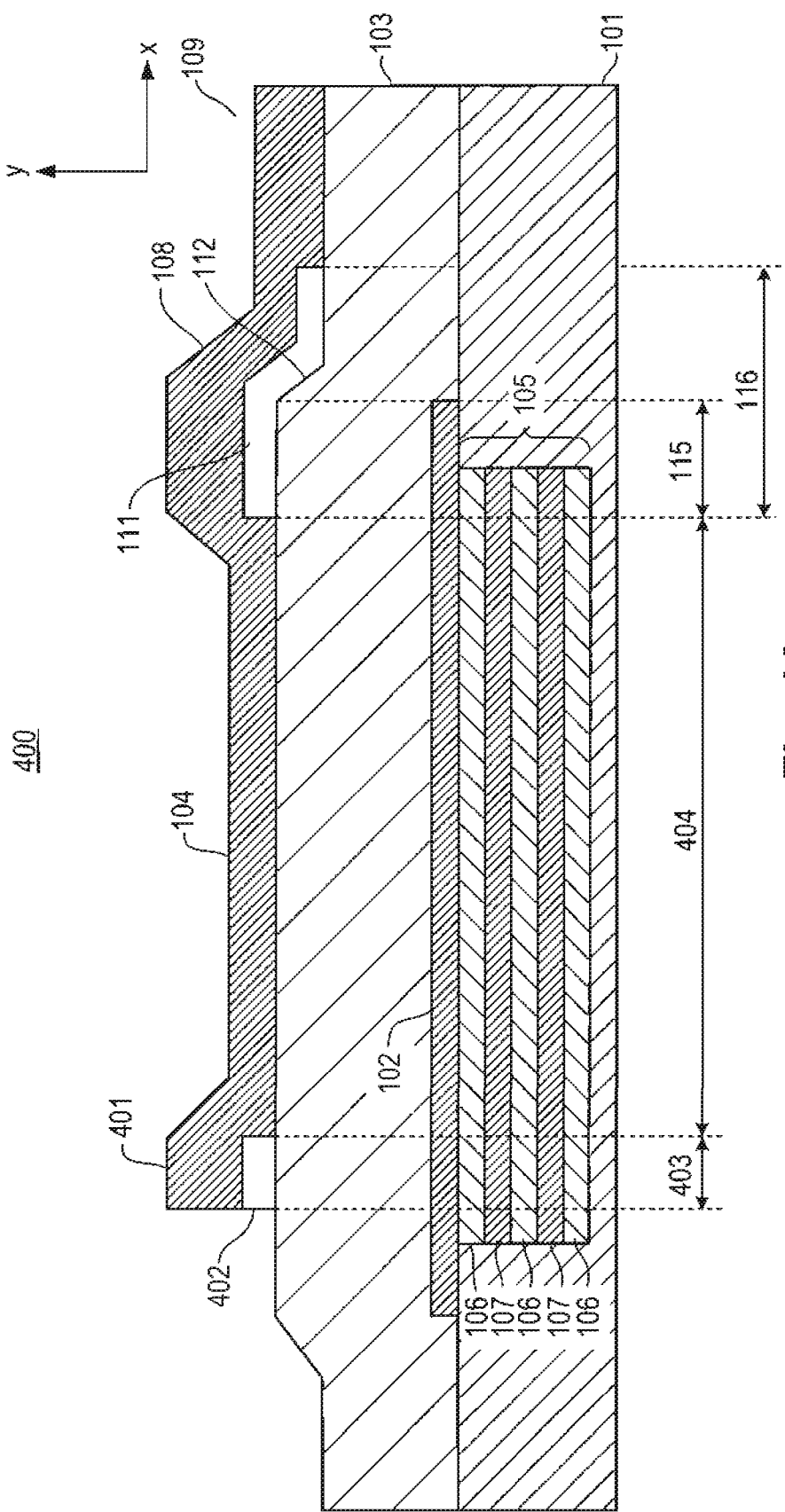
FIG. 4 shows a cross-sectional view of a solid mount bulk acoustic resonator (SMR) in accordance with a representative embodiment.

FIG. 4A shows a cross-sectional view of an acoustic resonator 400 in accordance with a representative embodiment and taken along the line 4B-4B. Many of the features of the acoustic resonator 400 are common to those of acoustic resonators 100, 200, 300 described in connection with representative embodiments in FIGS. 1A-3. The details of common features, characteristics and benefits thereof are often not repeated in order to avoid obscuring the presently described embodiments.

The acoustic resonator 400 comprises substrate 101. First electrode 102 is disposed over the substrate 101. Piezoelectric layer 103 is disposed over the first electrode 102 and the second electrode 104 is disposed over the piezoelectric layer 103. The first and second electrodes 102, 104 include an electrically conductive material and provide an oscillating electric field in the y-direction, which is the direction of the thickness of the piezoelectric layer 103. In the present illustrative embodiment, the y-axis (of the coordinate system depicted in FIG. 4) is the axis for the TE (longitudinal) mode(s) for the resonator. The acoustic resonator 400 comprises acoustic reflector 105 described above.

The acoustic resonator 400 comprises bridge 108 along the interconnection side 109. The bridge 108 provides gap 11, which may be a void (e.g., air) or may be filled with a low acoustic impedance material. A cantilevered portion 401 of the second electrode 104 is provided on at least one side of the second electrode 104. The cantilevered portion 401 may also be referred to as a 'wing.'

The first and second electrodes 102, 104 each comprise an electrically conductive material (e.g., molybdenum (Mo)) and provide an oscillating electric field in the y-direction of the coordinate system shown (i.e., the direction of the thickness of the piezoelectric layer 103). In the illustrative embodiment described presently, the y-axis is the axis for the TE (longitudinal) mode(s) for the resonator.

The cantilevered portion 401 of the second electrode 104 extends over a gap 402, which illustratively comprises air. In a representative embodiment, a sacrificial layer (not shown) is deposited by known technique over the first electrode 102 and a portion of the piezoelectric layer 103. As described above, the sacrificial layer comprises phosphosilicate glass (PSG), which illustratively comprises 8% phosphorous and 92% silicon dioxide. After the formation of the second electrode 104, the sacrificial layer is etched away illustratively with hydrofluoric acid leaving the cantilevered portion 401.

Notably, rather than air, the gap 402 may comprise other materials including low acoustic impedance materials, such as carbon (C) doped $SiO_2$, which is also referred as Black-diamond; or dielectric resin commercially known as SiLK; or benzocyclobutene (BCB). Such low acoustic impedance materials may be provided in the gap 402 by known methods. The low acoustic impedance material may be provided after removal of sacrificial material used to form the gap 402, or may be used instead of the sacrificial material in the gap 402, and not removed.

The region of contacting overlap of the first and second electrodes 102, 104, the piezoelectric layer 103 and the acoustic reflector 105 is referred to as the active area 404 of the acoustic resonator 400. By contrast, an inactive area of the acoustic resonator 400 comprises a region of overlap between first electrode 102 or second electrode 104, or both, and the piezoelectric layer 103 not disposed over the acoustic reflector 105. Beneficially, the bridge 108 and the cantilevered portion 401 provide an acoustic impedance discontinuity and thus change boundary condition at their respective interfaces. These impedance discontinuities foster reflection of waves back to the active area 404 of the acoustic resonator 400 for conversion into desired TE modes, and suppress unwanted lateral modes from being reflected back into the active area 404. In addition, the bridge 108 effectively separates the second electrode 104 from portions of the piezoelectric layer 103 where possible defects introduced during growth at the first electrode 102 in order to achieve better Q.

The cantilevered portion 401 extends beyond an edge of the active area 114 by a width 403 as shown. An electrical connection 109 is made to a signal line (not shown) and electronic components (not shown) selected for the particular application of the acoustic resonator 100. This portion of the acoustic resonator 400 comprises interconnection side 109 of the acoustic resonator 100. As will become clearer as the present description continues, the interconnection side 109 of the second electrode 104 to which the electrical contact is made does not comprise a cantilevered portion. By contrast, one or more non-connecting sides of the acoustic resonator 400 may comprise cantilevered portions 401 that extend beyond the edge of the active area 404.

Figure 4B:
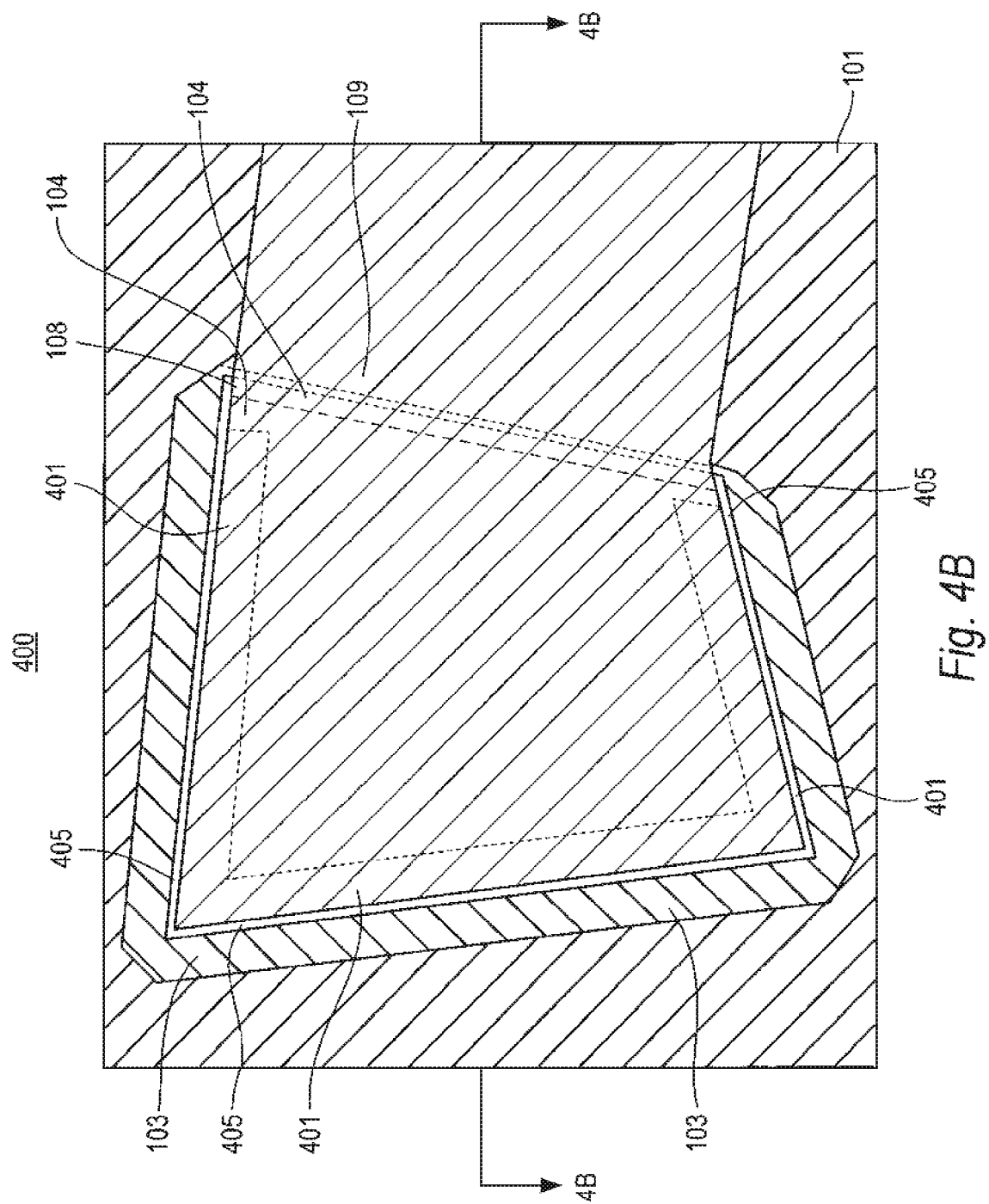

FIG. 4B shows a top view of the acoustic resonator 400 shown in cross-sectional view in FIG. 4A and in accordance with a representative embodiment. The acoustic resonator 100 also comprises the second electrode 104 with an optional passivation layer (not shown) disposed thereover. In a representative embodiment, cantilevered portions 401 are provided along each non-contacting side 405 and have the same width. This is merely illustrative, and it is also contemplated that at least one, but not all non-contacting sides 405, comprise a cantilevered portion 401. Furthermore, it is contemplated that the second electrode 104 comprises more or fewer than four sides as shown. For example, a pentagonal-shaped (e.g., as shown in FIG. 1B) second electrode is contemplated comprising four sides with cantilevered portions (e.g., cantilevered portion 401) on one or more of the sides, and the fifth side providing the interconnection side. In a representative embodiment, the shape of the first electrode 102 is substantially identical to the shape of the second electrode 104. Notably, the first electrode 102 may comprise a larger area than the second electrode 104, and the shape of the first electrode 102 may be different than the shape of the second electrode 104. It is further noted that electrical connections may be made to more than one side (e.g., more than just interconnection side 109), with the remaining edges being non-connection edges and comprising cantilevered portions 401. Finally, it is noted that the cantilevered portions 401 may have the same width 403, although this is not essential, and the cantilevered portions 401 may have different widths 403.

As noted above, a quantitative and qualitative understanding of the Q of a resonator may be obtained by plotting on a Smith Chart the ratio of the reflected energy to applied energy as the frequency is varied for the case in which one electrode is connected to ground and another to signal, for an SMR resonator with an impedance equal to the system impedance at the resonant frequency. As the frequency of the applied energy is increased, the magnitude/phase of the SMR resonator sweeps out a circle on the Smith Chart. This is referred to as the Q-circle. Where the Q-circle first crosses the real axis (horizontal axis), this corresponds to the series resonance frequency $f_s$. The real impedance (as measured in Ohms) is $R_s$. As the Q-circle continues around the perimeter of the Smith chart, it again crosses the real axis. The second point at which the Q circle crosses the real axis is labeled $f_p$, the parallel or anti-resonant frequency of the FBAR. The real impedance at $f_p$ is $R_p$.

Often it is desirable to minimize $R_s$ while maximizing $R_p$. Qualitatively, the closer the Q-circle "hugs" the outer rim of the Smith chart, the higher the Q-factor of the device. The Q-circle of an ideal lossless resonator would have a radius of one and would be at the edge of the Smith chart. However, as noted above, there are energy losses that impact the Q-factor of the device. For instance, and in addition to the sources of acoustic losses mentioned above, Rayleigh-Lamb (lateral or spurious) modes are in the x,y dimensions of the piezoelectric layer 103. These lateral modes are due to interfacial mode conversion of the longitudinal mode traveling in the z-direction; and due to the creation of non-zero propagation vectors, $k_x$ and $k_y$, for both the TE mode and the various lateral modes (e.g., the S0 (symmetric) mode and the zeroth and first order (asymmetric) modes, A0 and A1), which are due to the difference in effective velocities between the regions where electrodes are disposed and the surrounding regions of the resonator where there are no electrodes. At a specific frequency, the acoustic wavelength of an acoustic resonator is determined by v/f, where v is acoustic velocity and f is frequency. It is believed that periodicity of Qp (i.e., the position of maxima and minima as a function of the width of the cantilevered portion 401) is related to the acoustic wave length. At a maxima of Qp, the vibration of the cantilevered portion 401 is comparatively far from its mechanical resonance; while at a minima mechanical resonance of the cantilevered portion 401 occurs. It is believed that the maxima of Qp is related to the interaction of the mechanical resonance of the cantilevered portion 401 with the acoustic vibration from the piezoelectric layer 103. Qp peaks occur when the width 403 of the cantilevered portion 401 is above a certain value. The maximum value of Qp occurs when the mechanical resonance of the cantilevered portion 401 is equal to $n\lambda/4$, where n=1, 2, . . . . Notably, as frequency decreases, acoustic wave length increases, and the width of the cantilevered portion 401 at a maxima increases accordingly.

Regardless of their source, the lateral modes are parasitic in many resonator applications. For example, the parasitic lateral modes couple at the perimeter of the resonator and remove energy available for the longitudinal modes and thereby reduce the Q-factor of the resonator device. Notably, as a result of parasitic lateral modes and other acoustic losses sharp reductions in Q can be observed on a Q-circle of the Smith Chart of the $S_{11}$ parameter. These sharp reductions in Q-factor are known as "rattles" or "loop-de-loops," which are shown and described below.

The cantilevered portion(s) 401 of the representative embodiments provide a change in the acoustic impedance at the boundary of the active region 414 of the acoustic resonator 400. As a result, reflections of lateral modes at the boundary are promoted. In a representative embodiment, the boundary of the active area 404 of the acoustic resonator 400 and the cantilevered portion 401 comprises solid materials (first and second electrodes 102, 104 and piezoelectric layer 103) and air, which presents a comparatively large impedance mismatch and a comparatively high reflection coefficient. As a result, lateral modes are comparatively highly reflected, which improves the Q-factor by two mechanisms. First, because the reflected lateral modes are not transmitted, their energy is not lost. Improving the losses by reducing transmission of lateral modes outside the active area 404 of the acoustic resonator 400 can increase the Q-factor of the acoustic resonator 400. Second, a portion of the reflected lateral modes is converted into desired longitudinal modes. The greater the wave energy is in longitudinal modes, the higher the Q-factor. As a result, the cantilevered portion(s) 401 of the acoustic resonator 400 enhances the Q-factor of both the parallel and the series resonance (i.e., $Q_p$ and $Q_s$).

Figure 5:
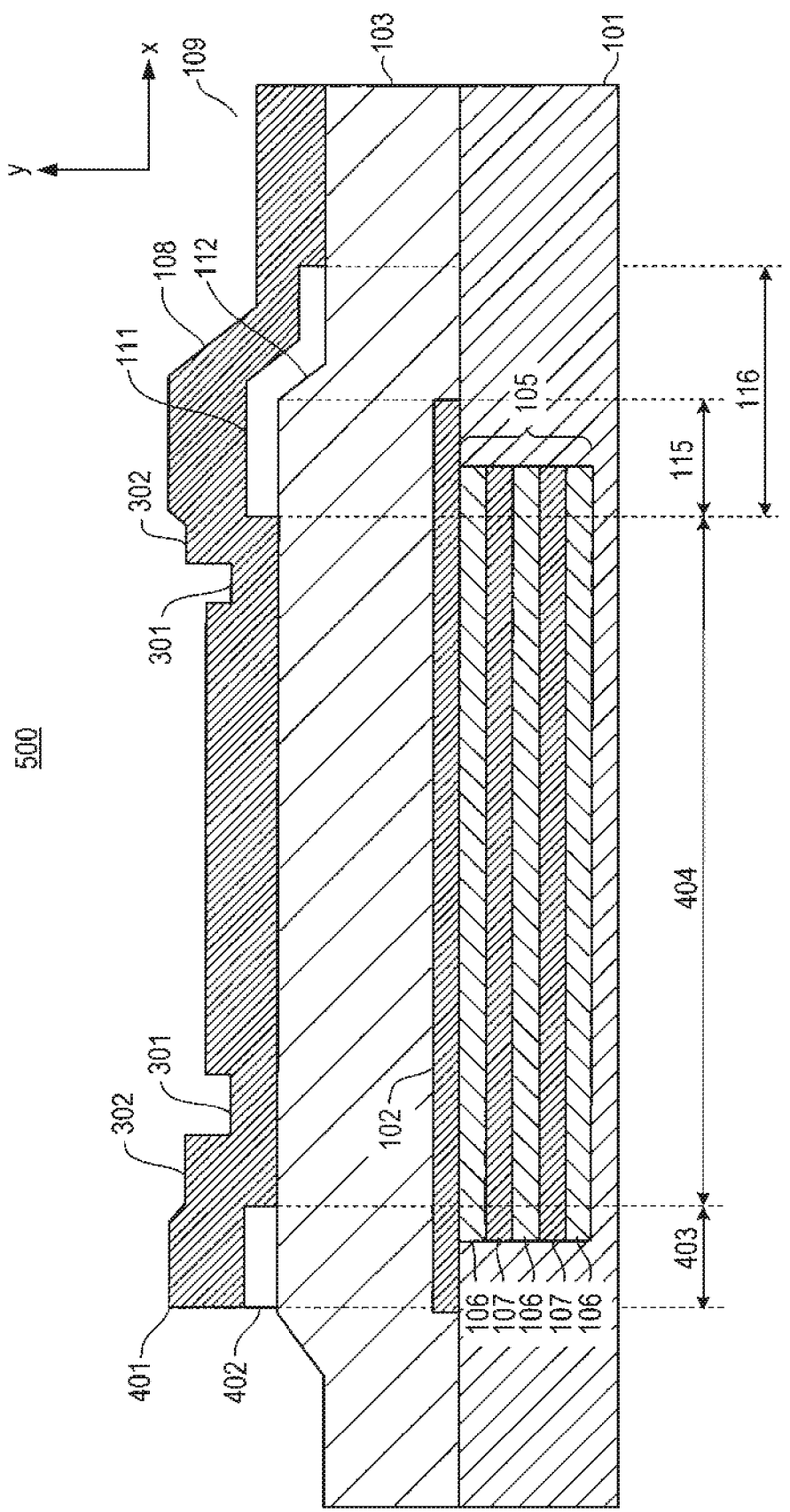
FIG. 5 shows a cross-sectional view of a solid mount bulk acoustic resonator (SMR) in accordance with a representative embodiment.

FIG. 5 shows a cross-sectional view of an acoustic resonator 500 in accordance with a representative embodiment. Many of the features of the acoustic resonator 500 are common to those of acoustic resonators 100, 200, 300 and 400 described in connection with representative embodiments in FIGS. 1A-4. The details of common features, characteristics and benefits thereof often are often not repeated in order to avoid obscuring the presently described embodiments.

The acoustic resonator 500 comprises substrate 101. First electrode 102 is disposed over the substrate 101. Piezoelectric layer 103 is disposed over the first electrode 102 and the second electrode 104 is disposed over the piezoelectric layer 103. The first and second electrodes 102, 104 include an electrically conductive material and provide an oscillating electric field in the y-direction, which is the direction of the thickness of the piezoelectric layer 103. In the present illustrative embodiment, the y-axis (of the coordinate system depicted in FIG. 4) is the axis for the TE (longitudinal) mode(s) for the resonator. The acoustic resonator 500 comprises acoustic reflector 105 described above.

The acoustic resonator 500 comprises bridge 108 along the interconnection side 109. The bridge 108 provides gap 111, which may be a void (e.g., air) or may be filled with a low acoustic impedance material. A cantilevered portion 401 of the second electrode 104 is provided on at least one side of the second electrode 104. The cantilevered portion 401 of the second electrode 104 extends over a gap 402, which illustratively comprises air. In a representative embodiment, a sacrificial layer (not shown) is deposited by known technique over the first electrode 102 and a portion of the piezoelectric layer 103. As described above, the sacrificial layer comprises phosphosilicate glass (PSG), which illustratively comprises 8% phosphorous and 92% silicon dioxide. After the formation of the second electrode 104, the sacrificial layer is etched away illustratively with hydrofluoric acid leaving the cantilevered portion 401.

Additionally, the acoustic resonator 500 comprises recess 301 (often referred to as an 'innie') and a frame element 302 (also referred to as an 'outie'). The recess 301 and frame element 302 provide an acoustic mismatch at the perimeter of the second electrode 104, improve reflections of acoustic waves at the impedance discontinuity, and consequently reduce acoustic losses in the acoustic resonator 500. The recess 301 improves the Q of the acoustic resonator 500 near and below series resonance (f) and thereby improves $Q_s$ and $R_s$. The frame element 302 improves the impedance at parallel resonance ($R_p$). Balancing of $Q_s$ and $Q_p$ is achieved through the inclusion of the recess 301 and the frame element 302 at the bridge 108 and cantilevered portion 401 as depicted in FIG. 5.

The region of overlap of the first and second electrodes 102, 104, the piezoelectric layer 103 and the acoustic reflector 105 that does not include recess 301 or frame elements 302 (i.e., "inside" the recess 301 in the embodiment depicted in FIG. 3) define the active area 114 of the acoustic resonator 500. By contrast, an inactive area of the acoustic resonator 500 comprises a region of overlap between first electrode 102, or second electrode 104, or both, and the piezoelectric layer 103 not disposed over the acoustic reflector 105. It is beneficial to the performance of the resonator to reduce the magnitude of the inactive area of the acoustic resonator 500 to the extent practical, and to remove portions of the piezoelectric layer 103 having defects due to the termination of the first electrode 102. These measures result in reduced losses, which translate into an improved Q-factor of the acoustic resonator 500.

Figure 6A:
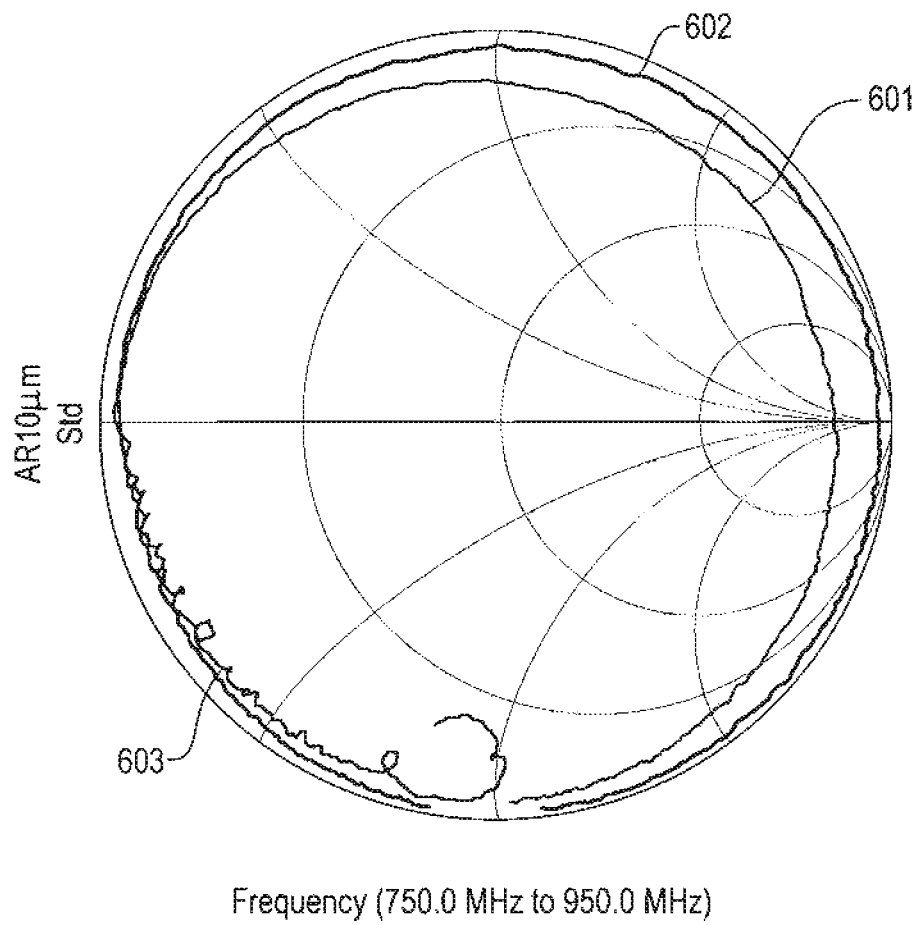
FIG. 6A is a graphical representation of a Q-circle on a Smith Chart of the $S_{11}$ parameter for an acoustic resonator of an SMR of a representative embodiment, and a Q-circle a known SMR.
Figure 6B:
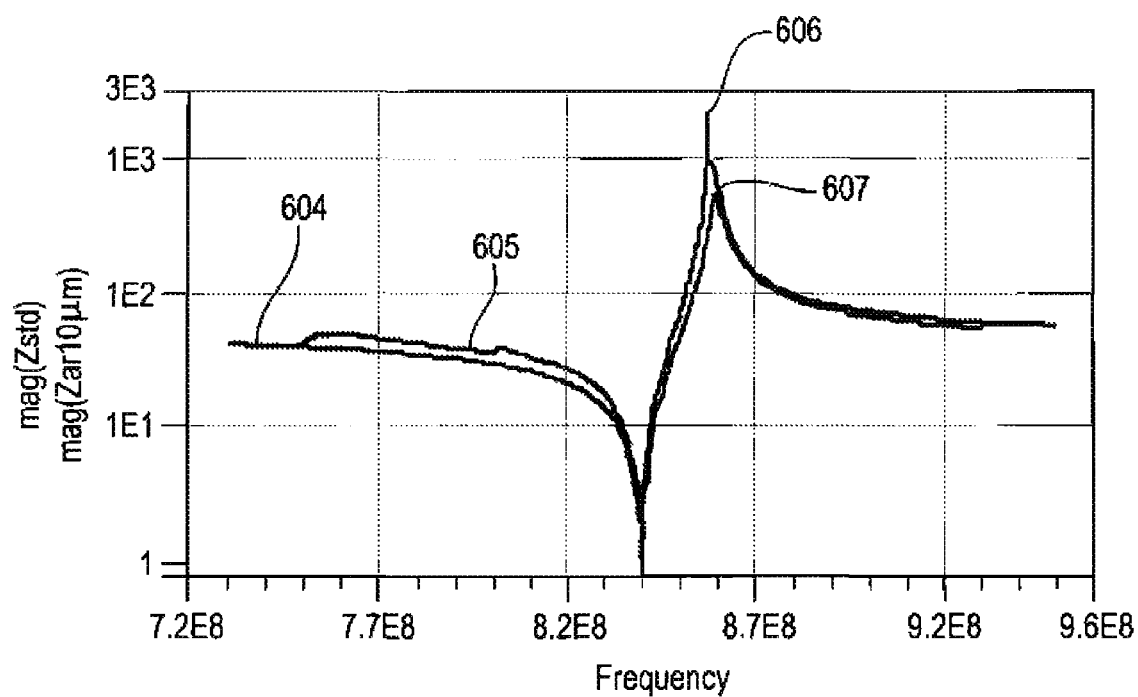
FIG. 6B shows a graph of the parallel impedance ($R_p$) for SMRs including an SMR of a representative embodiment.

FIG. 6A is a graphical representation of a Q-circle of the Smith Chart of the $S_{11}$ parameter for an acoustic resonator comprising bridge 108 and cantilevered portion 401 (e.g., acoustic resonator 400), and a Q-circle a known solid mount bulk acoustic resonator. FIG. 6B shows a graph of the impedance $R_p$ at parallel resonance for an acoustic resonator comprising bridge 108 and cantilevered portion 401 (e.g., acoustic resonator 400), and a known solid mount bulk acoustic resonator.

Curve 601 depicts the Q-circle of the known acoustic resonator, and curve 602 depicts an acoustic resonator of a representative embodiment (e.g., acoustic resonator 400). As can be appreciated, the Q-circle of curve 602 "hugs" the outer rim of the Smith chart more closely than the Q-circle of the known acoustic resonator (curve 601). As such, the bridge 108 and cantilevered portion 401 provide a significant improvement in the Q-factor compared to a known acoustic resonator. Notably, as a result of the incorporation of frame element 302, use to improve higher $R_p$, "rattles" 603 occur in the Q-circle at frequencies of operation below $f_s$ (sometimes referred to as the southwest quadrant with $Q_{sw}$ indicative of the Q value in the southwest quadrant of the Smith chart.) However, there is significant improvement in $R_p$. However, there is significant improvement in $R_p$. Curve 604 depicts acoustic impedance versus frequency of a known acoustic resonator, and curve 605 depicts acoustic impedance of an acoustic resonator of a representative embodiment. As can be appreciated from a review of FIG. 6B, $R_p$ of the acoustic resonator of a representative embodiment reaches a maximum at point 606, which is significantly greater that the maximum $R_p$ of a known acoustic resonator (point 607).

As should be appreciated, there are performance considerations that are prioritized in designing a solid mount bulk acoustic resonator and filter comprising same. The present teachings beneficially provide flexibility in the selection of certain components to meet a particular desired end. For example, the various components of the representative embodiments implemented can be selected to attain a particular design for a desired performance goal. For example, the solid mount bulk acoustic resonators can include a frame element (e.g., frame element 302) over the bridge 108 and the cantilevered portion (e.g., cantilevered portion 401) in order to attain a higher value of $R_p$. Similarly, the recess 301 may be implemented to improve $Q_{sw}$.

Figure 7A:
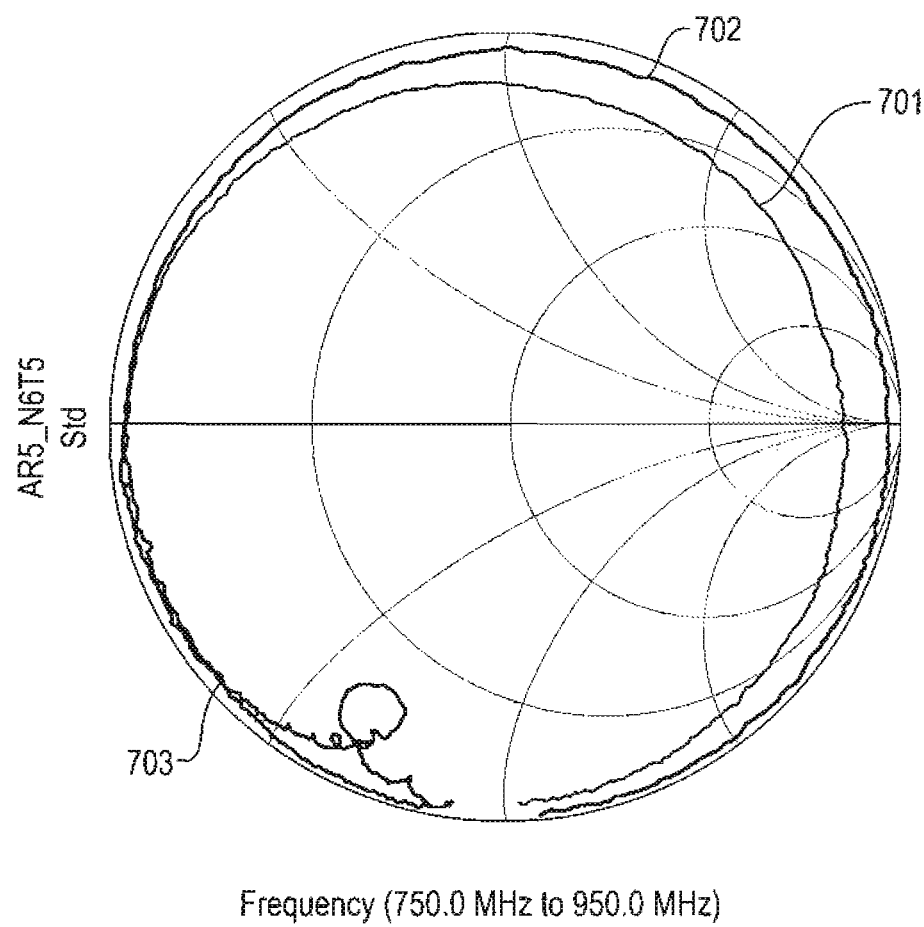
FIG. 7A is a graphical representation of a Q-circle on a Smith Chart of the $S_{11}$ parameter for an acoustic resonator of an SMR of a representative embodiment, and a Q-circle a known SMR.

FIG. 7A is a graphical representation of a Q-circle of the Smith Chart of the $S_{11}$ parameter for an acoustic resonator comprising bridge 108, cantilevered portion 401, recess 301 and frame element 302 (e.g., acoustic resonator 500), and a Q-circle a known solid mount bulk acoustic resonator. FIG. 6B shows a graph of the impedance $R_p$ at parallel resonance for an acoustic resonator comprising bridge 108, cantilevered portion 401, recess 301 and frame element 302 (e.g., acoustic resonator 500), and a known solid mount bulk acoustic resonator.

Curve 701 depicts the Q-circle of the known acoustic resonator, and curve 702 depicts an acoustic resonator of a representative embodiment (e.g., acoustic resonator 500). As can be appreciated, the Q-circle of curve 702 "hugs" the outer rim of the Smith chart more closely than the Q-circle of the known acoustic resonator (curve 701). As such, the combination of the bridge 108, cantilevered portion 401, recess 301 and frame element 302 provide a significant improvement in the Q-factor compared to a known acoustic resonator. Moreover, "rattles" at frequencies of operation below $f_s$ are "smoothed" (e.g., rattles 703 of FIG. 7A are much less pronounced than rattles 603) the bridge 108, cantilevered portion 401, recess 301 and frame element 302. Additionally, there is significant improvement in $R_p$ realized by the combination of the bridge 108, cantilevered portion 401, recess 301 and frame element 302 in the acoustic resonator of the representative embodiment.

Figure 7B:
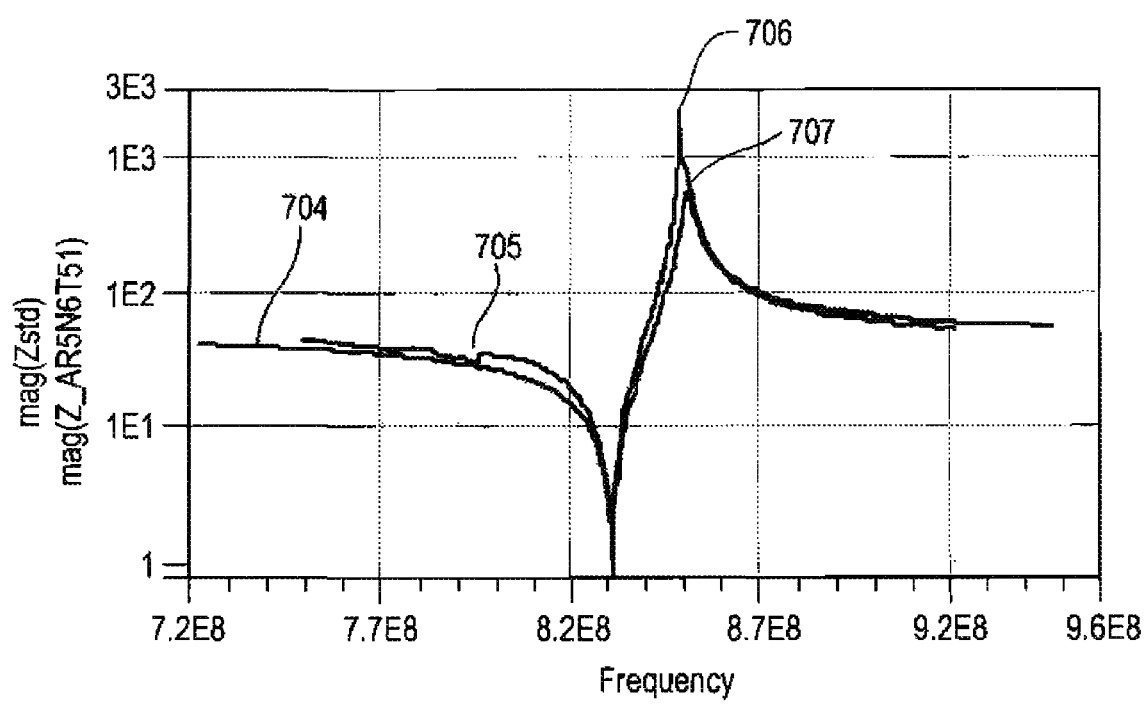
FIG. 7B shows a graph of the parallel impedance ($R_p$) for SMRs including an SMR of a representative embodiment.

Turning to FIG. 7B, curve 704 depicts acoustic impedance versus frequency of a known acoustic resonator, and curve 705 depicts acoustic impedance versus frequency of an acoustic resonator of a representative embodiment. As can be appreciated from a review of FIG. 7B, $R_p$ of an acoustic resonator of a representative embodiments (point 706) is significantly greater that the $R_p$ of a known acoustic resonator (point 707). Accordingly, the acoustic resonator 500 provides improvement of both $Q_{sw}$ and $R_p$ compared to a known solid mount acoustic resonator.

In accordance with representative embodiments, acoustic resonators for various applications such as in electrical filters are described. One of ordinary skill in the art appreciates that many variations that are in accordance with the present teachings are possible and remain within the scope of the appended claims. These and other variations would become clear to one of ordinary skill in the art after inspection of the specification, drawings and claims herein. The invention therefore is not to be restricted except within the spirit and scope of the appended claims.

The invention claimed is:

1. A solid mount bulk acoustic wave resonator, comprising:
   a first electrode;
   a second electrode comprising a first surface disposed substantially at a first height;
   a piezoelectric layer disposed between the first and second electrodes;
   an acoustic reflector comprising a plurality of layers and disposed beneath the first electrode, the second electrode and the piezoelectric layer, a contacting overlap of the acoustic reflector, the first electrode, the second electrode and the piezoelectric layer defining an active area of the solid mount bulk acoustic wave resonator, and adjacent to a termination of the active area of the solid mount bulk wave acoustic resonator, the piezoelectric layer comprises a transition comprising defects, wherein the first electrode substantially covers the acoustic reflector, the piezoelectric layer extends over an edge of the first electrode, and the second electrode does not contact the transition; and
   a bridge comprising a second surface disposed substantially at a second height, which is higher than the first height, the bridge being disposed adjacent to a termination of the active area of the solid mount bulk acoustic wave resonator, and the bridge overlaps a portion of the first electrode.

2. A solid mount bulk acoustic wave resonator as claimed in claim 1, further comprising an electrical connection to one of a plurality of sides of the second electrode, wherein the bridge is disposed between the electrical connection and the one of the plurality of sides of the second electrode.

3. A solid mount bulk acoustic wave resonator as claimed in claim 1, wherein a gap comprises a region between the second electrode and the piezoelectric layer.

4. A solid mount bulk acoustic wave resonator as claimed in claim 3, wherein the transition is disposed beneath the region of the gap.

5. A solid mount bulk acoustic wave resonator as claimed in claim 1, wherein the second electrode comprises an upper surface with a side and a recess is disposed along the side.

6. A solid mount bulk acoustic wave resonator as claimed in claim 1, wherein the second electrode comprises an upper surface with a side, and a frame element is disposed along the side.

7. A solid mount bulk acoustic wave resonator as claimed in claim 1, wherein the acoustic reflector comprises a Bragg reflector.

8. A solid mount bulk acoustic wave resonator as claimed in claim 7, wherein the second electrode comprises an upper surface with a side and a recess is disposed along the side.

9. A solid mount bulk acoustic wave resonator as claimed in claim 7, wherein the second electrode comprises an upper surface with a side, and a frame element is disposed along the side.

10. A solid mount bulk acoustic wave resonator as claimed in claim 7, further comprising a low acoustic impedance material in a gap provided by the bridge.

11. A solid mount bulk acoustic wave resonator, comprising:
    a first electrode;
    a second electrode comprising a plurality of sides, at least one of the plurality of sides comprising a cantilevered portion, wherein the second electrode comprises a first surface disposed substantially at a first height, and the cantilevered portion comprises a second surface disposed substantially at a second height, which is higher than the first height;
    a piezoelectric layer disposed between the first and second electrodes;
    an acoustic reflector comprising a plurality of layers and disposed beneath the first electrode, the second electrode and the piezoelectric layer, a contacting overlap of the acoustic reflector, the first electrode, the second electrode and the piezoelectric layer defining an active area of the solid mount bulk acoustic wave resonator, and adjacent to a termination of the active area of the solid mount bulk acoustic wave resonator, the piezoelectric layer comprises a transition comprising defects, wherein the first electrode substantially covers the acoustic reflector, the piezoelectric layer extends over an edge of the first electrode, and the second electrode does not contact the transition; and
    a bridge adjacent to a termination of the active area of the solid mount bulk acoustic wave resonator, wherein the bridge overlaps a portion of the first electrode.

12. A solid mount bulk acoustic wave resonator as claimed in claim 11, further comprising an electrical connection to one of a plurality of sides of the second electrode, wherein the bridge is disposed between the electrical connection and the one of the plurality of side of the second electrode.

13. A solid mount bulk acoustic wave resonator as claimed in claim 11, wherein the bridge comprises a gap.

14. A solid mount bulk acoustic wave resonator as claimed in claim 13, further comprising a low acoustic impedance material in the gap provided by the bridge.

15. A solid mount bulk acoustic wave resonator as claimed in claim 13, wherein the gap provided by the bridge comprises a region between the second electrode and the piezoelectric layer.

16. A solid mount bulk acoustic wave resonator as claimed in claim 15, wherein the transition is disposed beneath the region of the gap provided by the bridge.

17. A solid mount bulk acoustic wave resonator as claimed in claim 15, wherein the gap comprises air.

18. A solid mount bulk acoustic wave resonator as claimed in claim 15, wherein the gap is a first gap, and a second gap exists beneath the cantilevered portion and the second gap comprises either low acoustic impedance material or air.

19. A solid mount bulk acoustic wave resonator as claimed in claim 11, wherein the second electrode comprises an upper surface with a side and a recess is disposed along the side.

20. A solid mount bulk acoustic wave resonator as claimed in claim 11, wherein the second electrode comprises an upper surface with a side, and a frame element is disposed along the side.

21. A solid mount bulk acoustic wave resonator as claimed in claim 11, wherein the acoustic reflector comprises a Bragg reflector.

22. A solid mount bulk acoustic wave resonator as claimed in claim 21, wherein the second electrode comprises an upper surface with a side and a recess is disposed along the side.

23. A solid mount bulk acoustic wave resonator as claimed in claim 21, wherein the second electrode comprises an upper surface with a side, and a frame element is disposed along the side.

24. A solid mount bulk, acoustic wave resonator as claimed in claim 21, further comprising a low acoustic impedance material beneath the bridge.

25. A solid mount bulk acoustic wave resonator, comprising:
a first electrode;
a second electrode comprising a first surface disposed substantially at a first height;
a piezoelectric layer disposed between the first and second electrodes;
an acoustic reflector comprising a plurality of layers and disposed beneath the first electrode, the second electrode and the piezoelectric layer, a contacting overlap of the acoustic reflector, the first electrode, the second electrode and the piezoelectric layer defining an active area of the solid mount bulk acoustic wave resonator, and adjacent to termination of the active area of the solid mount bulk acoustic wave resonator, the piezoelectric layer comprises a transition comprising defects, wherein the first electrode substantially covers the acoustic reflector, and the piezoelectric layer extends over an edge of the first electrode; and
a bridge comprising a second surface disposed substantially at a second height, which is higher than the first height, the bridge being disposed adjacent to a termination of the active area of the solid mount bulk acoustic wave resonator, wherein a gap exists above the transition, wherein the bridge overlaps a portion of the first electrode.

26. A solid mount bulk acoustic wave resonator as claimed in claim 25, wherein the second electrode comprises an upper surface with a side and a recess is disposed along the side.

27. A solid mount bulk acoustic wave resonator as claimed in claim 25, wherein the second electrode comprises an upper surface with a side, and a frame element is disposed along the side.

28. A solid mount bulk acoustic wave resonator as claimed in claim 25, wherein the acoustic reflector comprises a Bragg reflector.

29. A solid mount bulk acoustic wave resonator as claimed in claim 28, wherein the second electrode comprises an upper surface with a side and a recess is disposed along the side.

30. A solid mount bulk acoustic wave resonator as claimed in claim 28, wherein the second electrode comprises an upper surface with a side, and a frame element is disposed along the side.

31. A solid mount bulk acoustic wave resonator as claimed in claim 25, further comprising a low acoustic impedance material in the gap provided by the bridge.

* * * * *